United States Patent
Choi et al.

(10) Patent No.: US 11,784,854 B2
(45) Date of Patent: Oct. 10, 2023

(54) RECEIVER INCLUDING A MULTI-RATE EQUALIZER

(71) Applicants: SK hynix Inc., Icheon (KR); Seoul National University R&DB Foundation, Seoul (KR)

(72) Inventors: Moon-Chul Choi, Seoul (KR); Sanghee Lee, Seoul (KR); Seungha Roh, Seoul (KR); Kwangho Lee, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 160 days.

(21) Appl. No.: 17/401,011

(22) Filed: Aug. 12, 2021

(65) Prior Publication Data

US 2022/0294673 A1  Sep. 15, 2022

(30) Foreign Application Priority Data

Mar. 9, 2021 (KR) .......................... 10-2021-0030712

(51) Int. Cl.
*H04L 25/03* (2006.01)
*H04L 7/02* (2006.01)
*H04B 1/16* (2006.01)

(52) U.S. Cl.
CPC ......... *H04L 25/03019* (2013.01); *H04B 1/16* (2013.01); *H04L 7/02* (2013.01)

(58) Field of Classification Search
CPC ........ H04L 25/03019; H04L 7/02; H04B 1/16
See application file for complete search history.

(56) References Cited

U.S. PATENT DOCUMENTS

| | | | | |
|---|---|---|---|---|
| 9,667,407 B1* | 5/2017 | Liu | ....................... | H03B 5/1212 |
| 10,447,506 B1* | 10/2019 | Farjadrad | ................ | H04L 25/40 |
| 10,466,301 B1* | 11/2019 | Lee | ..................... | G01R 31/3171 |
| 11,070,351 B1* | 7/2021 | Chepuri | .............. | H04L 25/4917 |
| 2008/0019435 A1* | 1/2008 | Chou | ........................ | H04L 1/20 375/232 |
| 2015/0229314 A1* | 8/2015 | Hata | ..................... | H03L 7/0807 327/199 |
| 2019/0199563 A1 | 6/2019 | Zerbe et al. | | |

FOREIGN PATENT DOCUMENTS

KR   10-2019-0137757 A   12/2019

OTHER PUBLICATIONS

W. Rahman et al., "A 22.5-to-32Gb/s 3.2pJ/b referenceless baud-rate digital CDR with DFE and CTLE in 28nm CMOS," ISSCC, pp. 120-121, 2017.
D. Yoo, et al., "A 36Gb/s Adaptive Baud-Rate CDR with CTLE and 1-Tap DFE in 28nm CMOS," ISSCC, pp. 126-128, 2019.

(Continued)

*Primary Examiner* — Freshteh N Aghdam (57) ABSTRACT

A receiver includes an equalization circuit configured to output a data sample signal and an edge sample signal by sampling a data input signal according to clock signal, and to perform an equalization operation according to the data sample signal and the edge sample signal; and a clock gate circuit configured to select the clock signals from among a plurality of multi-phase clock signals according to a selection signal.

13 Claims, 8 Drawing Sheets

(56) References Cited

OTHER PUBLICATIONS

M. Choi, et al., "A 0.1-pJ/b/dB 28-Gb/s Maximum-Eye Tracking, Weight-Adjusting MM CDR and Adaptive DFE with Single Shared Error Sampler," Symp. VLSI Circuits, pp. 1-2, 2020.
K. Park, et al., "A 6.4-to-32Gb/s 0.96pJ/b Referenceless CDR Employing ML-Inspired Stochastic Phase-Frequency Detection Technique in 40nm CMOS," ISSCC, pp. 124-126, 2020.
P. Upadhyaya et al., "A 0.5-to-32.75Gb/s flexible-reach wireline transceiver in 20nm CMOS," ISSCC, pp. 1-3, 2015.
T. Kawamoto et al., "Multi-standard 185fsrms 0.3-to-28Gb/s 40dB backplane signal conditioner with adaptive pattern-match 36-Tap DFE and data-rate-adjustment PLL in 28nm CMOS," ISSCC, pp. 1-3, 2015.
M. S. Jalali et al., "A 4-Lane 1.25-to-28.05Gb/s multi-standard 6pJ/b 40dB transceiver in 14nm FinFET with Independent TX/RX rate support," ISSCC, pp. 106-108, 2018.
S. Chen et al., "A 4-to-16GHz inverter-based injection-locked quadrature clock generator with phase interpolators for multi-standard I/Os in 7nm FinFET," ISSCC, pp. 390-392, 2018.
W. Bae, et al., "A 0.36 pJ/bit, 0.025 mm2, 12.5 Gb/s Forwarded-Clock Receiver With a Stuck-Free Delay-Locked Loop and a Half-Bit Delay Line in 65-nm CMOS Technology," IEEE TCAS-I, vol. 63, No. 9, pp. 1393-1403, Sep. 2016.
J. Lee, et al., "A 0.1-pJ/b/dB 1.62-to-10.8-Gb/s Video Interface Receiver With Jointly Adaptive CTLE and DFE Using Biased Data-Level Reference," JSSC, vol. 55, No. 8, pp. 2186-2195, Aug. 2020.
B. Dehlaghi et al., "A 0.3 pJ/bit 20 Gb/s/Wire Parallel Interface for Die-to-Die Communication," JSSC, vol. 51, No. 11, pp. 2690-2701, Nov. 2016.

\* cited by examiner

|       | CK1   | CK2   | Dx   | Ex   |
|-------|-------|-------|------|------|
| 130-1 | CK0   | CK45  | D0   | E45  |
| 130-2 | CK90  | CK135 | D90  | E135 |
| 130-3 | CK180 | CK225 | D180 | E225 |
| 130-4 | CK270 | CK315 | D270 | E315 |

| GEN | x1 | x2 | x3 | x4 |
|---|---|---|---|---|
| GEN1, GEN2, GEN3 | - | - | - | - |
| GEN4 | E45 | - | - | E225 |
| GEN5 | D180 | D90 | D270 | - |

FIG. 8B

| GEN | x1 | x2 | x3 | x4 |
|---|---|---|---|---|
| GEN1, GEN2, GEN3 | - | - | - | E135 |
| GEN4 | - | - | - | - |
| GEN5 | D270 | D180 | D0 | - |

FIG. 8C

| GEN | x1 | x2 | x3 | x4 |
|---|---|---|---|---|
| GEN1, GEN2, GEN3 | - | - | - | - |
| GEN4 | E225 | - | - | E45 |
| GEN5 | D0 | D270 | D90 | - |

FIG. 8D

| GEN | x1 | x2 | x3 | x4 |
|---|---|---|---|---|
| GEN1, GEN2, GEN3 | - | - | - | - |
| GEN4 | - | - | - | - |
| GEN5 | D90 | D0 | D180 | - |

RECEIVER INCLUDING A MULTI-RATE EQUALIZER

CROSS-REFERENCE TO RELATED APPLICATION

The present application claims priority under 35 U.S.C. § 119(a) to Korean Patent Application No. 10-2021-0030712, filed on Mar. 9, 2021, which is incorporated herein by reference in its entirety.

BACKGROUND

1. Technical Field

Various embodiments generally relate to a receiver including a multi-rate equalizer.

2. Related Art

Interface technologies such as Peripheral Component Interconnect Express (PCIe) tend to increase the transmission speed of signals transmitted through channels as new generations of the interface technology are adopted, and the sampling rate also tends to increase to improve the transmission speed.

In general, the latest generation of the interface standard supports the previous generations of the interface standard at the same time. In this case, a multi-rate receiver supporting various sampling rates is used.

When a clock generating circuit that generates a wide range of frequencies to support various sampling rates is used, an area of the clock generating circuit may increase because additional circuits may be used.

In addition, the structure of an equalizer for responding to various frequencies is also complicated and power consumption increases.

Accordingly, there is a need for a technology capable of reducing circuit complexity and power consumption of a receiver while supporting multiple transmission speeds and sampling rates.

SUMMARY

In accordance with an embodiment of the present disclosure, a receiver may include an equalization circuit configured to output a data sample signal and an edge sample signal by sampling a data input signal according to a multi-phase clock signal, and to perform an equalization operation according to the data sample signal and the edge sample signal; and a clock gate circuit configured to select the multi-phase clock signal from among a plurality of multi-phase clock signals according to a selection signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and advantages of those embodiments.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described are possible. Further, modifications can be made to presented embodiments within the scope of teachings of the present disclosure. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
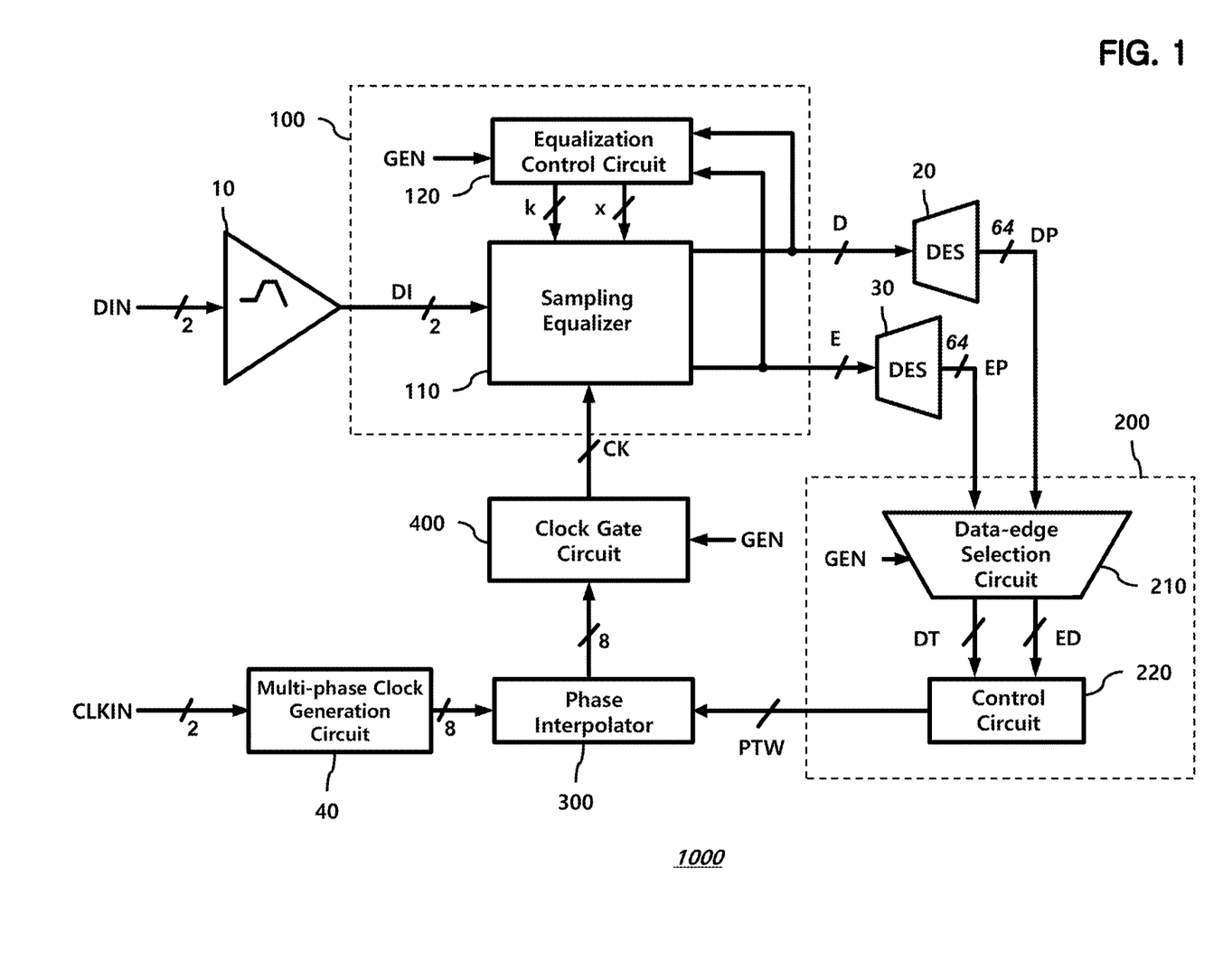
FIG. 1 illustrates a receiver according to an embodiment of the present disclosure.

FIG. 1 is a block diagram showing a receiver 1000 according to an embodiment of the present disclosure.

The receiver 1000 includes an equalization circuit 100, a phase control circuit 200, a phase interpolation circuit 300, and a clock gate circuit 400.

The receiver 1000 may further include a linear equalizer 10, a data parallelization circuit 20, an edge parallelization circuit 30, and a multi-phase clock generation circuit 40.

The linear equalizer 10 outputs a data input signal DI by equalizing a channel data signal DIN input through a channel.

The linear equalizer 10 may be implemented with a continuous time linear equalizer (CTLE), which is well known in the art, and thus a detailed disclosure is omitted.

In this embodiment, the channel data signal DIN and the data input signal DI are differential signals.

The linear equalizer 10 may be omitted, and in this case, the data input signal DI is the same as the channel data signal DIN.

The equalization circuit 100 outputs the data sample signal D and the edge sample signal E by sampling the data input signal DI and performing an equalization operation.

In this case, the data sample signal D for a generation may substantially correspond to a signal sampled from an edge for another generation, and the edge sample signal E for a generation may correspond to a signal sampled from data for another generation.

This will be described in detail below with reference to FIG. 2.

A plurality of data sample signals D and edge sample signals E may be generated in parallel according to phases of the multi-phase clock.

The data parallelization circuit 20 outputs a parallel data signal DP by parallelizing a plurality of data sample signals D in phase order.

The edge parallelization circuit 30 outputs a parallel edge signal EP by parallelizing a plurality of edge sample signals in phase order.

The phase control circuit 200 analyzes the parallel data signal DP and the parallel edge signal EP and outputs a phase control signal PTW.

The phase control circuit 200 includes a data edge selection circuit 210 and a control circuit 220.

The data edge selection circuit 210 selects necessary signals among the parallel data signal DP and the parallel edge signal EP according to the selection signal GEN, and outputs a data signal DT and an edge signal ED.

Here, the selection signal GEN serves to select a sampling rate. A value of the selection signal GEN may correspond to a generation of an interface technology.

For example, the peripheral component interconnect express (PCIe) interface technology has been developed in the order of first generation (GEN1), second generation (GEN2), third generation (GEN3), fourth generation (GEN4), and fifth generation (GEN5).

The first generation supports a data rate of 2.5 Gb/s, the second generation supports a data rate of 5 Gb/s, the third generation supports a data rate of 8 Gb/s, the fourth generation supports a data rate of 16 Gb/s, and the fifth generation supports a data rate of 32 Gb/s.

The frequency of the sampling clock varies depending on the generation, and accordingly, the timing at which data and edges are sampled varies. In addition, depending on the generation, it is necessary to be able to select the actually required data signal and edge signal from the parallel data signal DP and the parallel edge signal EP.

This will be described in detail below.

The phase interpolation circuit 300 outputs a phase-adjusted multi-phase clock signal by adjusting a phase of the multi-phase clock signal according to the phase control signal PTW.

The multi-phase clock signal input to the phase interpolation circuit 300 is output from the multi-phase clock generation circuit 40.

In this embodiment, the multi-phase clock generation circuit 40 generates an 8-phase clock signal having an equal phase difference from each other based on the differential clock input signal CLKIN input through a channel.

The clock gate circuit 400 selects and outputs a required clock signal CK according to the selection signal GEN from among the multi-phase clock signals output from the phase interpolation circuit 300.

The clock signal CK output from the clock gate circuit 400 is input to the equalization circuit 100 and is used to sample the data input signal DI to extract data and edges.

Figure 2A:
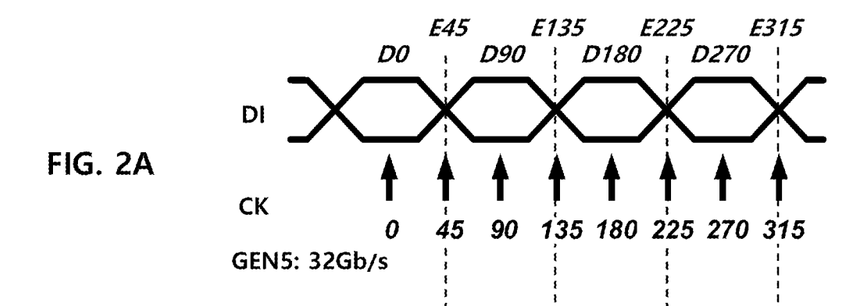
FIGS. 2A, 2B, and 2C illustrate multi-phase clock signals used in a receiver according to an embodiment of the present disclosure.
Figure 2B:
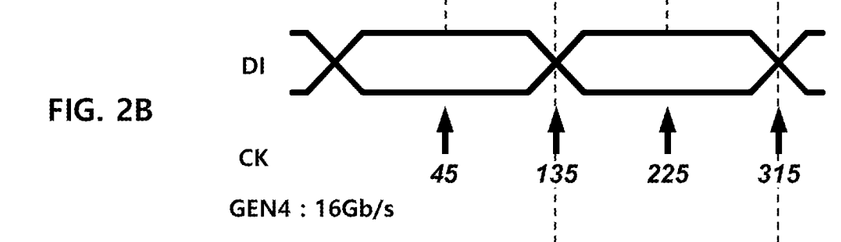
Figure 2C:
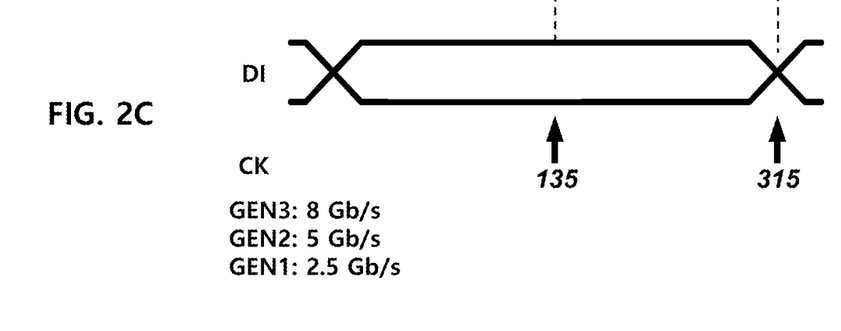

FIGS. 2A, 2B and 2C illustrate a multi-rate clock signal CK with a data input signal DI having different frequencies according to PCIe generations. In particular, the figures show rising edges of eight phases of the multi-rate clock signal CK.

FIG. 2A shows a clock signal CK and a data input signal DI according to the fifth generation of the PCIe interface, and FIG. 2B shows a clock signal CK and a data input signal DI according to the fourth generation of the PCIe interface, and FIG. 2C shows the clock signal CK and data input signal DI according to the first, second, or third generation of the PCIe interface.

The equalization circuit 100 samples data and edges from the data input signal DI using the clock signal CK.

As shown in the figures, the fifth generation supports a data rate of 32 Gb/s, the fourth generation supports a data rate of 16 Gb/s, and the third generation supports a data rate of 8 Gb/s.

First, assuming that the clocks will be used to receive a data input signal DI transmitted according to the fifth generation, 8 multi-phase clock signals with a frequency of 8 GHz are generated, and when the data input signal DI is instead transmitted according to fourth generation technology, four of the multi-phase clock signals may be used, and when the data input signal DI is instead transmitted according to third generation technology, two of the multi-phase clock signals may be used.

In addition, when the data input signal DI is instead transmitted according to the first generation supporting 2.5 Gb/s of date rate or the second generation supporting 5 Gb/s of data rate, 8 multi-phase clock signals having a frequency of 2.5 GHz or 5 GHz may be generated first and then two of those multi-phase clock signals may be used.

As shown in FIG. 2A, in the case of the fifth generation, the clock signal CK is an 8-phase clock signal and all 8 phases are used to sample data and edges.

That is, the data input signal DI is sampled by using the clock signal CK corresponding to phases of 0, 90, 180 and 270 degrees to generate the data sample signals D0, D90, D180, D270, and edge sample signals E45, E135, E225, and E315 are generated by sampling the data input signal DI using the clock signal CK corresponding to phases of 45, 135, 225, and 315 degrees.

As shown in FIG. 2B, in the case of the fourth generation, the clock signal CK is a 4-phase clock signal and is used to sample data and edges.

At this time, the clock signal CK in FIG. 2B may correspond to four phases of the clock signal CK in FIG. 2A.

Accordingly, clock signals CK corresponding to phases of 45 degrees and 225 degrees are used to sample data, and clock signals CK corresponding to phases of 135 degrees and 315 degrees are used to sample edges.

That is, edge sample signals E45 and E225 of the fifth generation correspond to data sample signals in the fourth generation, and the edge sample signals E135 and E315 of the 5th generation correspond to edge sample signals in the fourth generation.

As shown in FIG. 2C, in the case of the first, second, or third generation, the clock signal CK is a 2-phase clock signal and is used to sample data and edges.

Likewise, the clock signal CK in FIG. 2C may correspond to 2 phases of the clock signal CK in FIG. 2A.

Accordingly, a clock signal CK corresponding to a phase of 135 degrees is used to sample data, and a clock signal CK corresponding to a phase of 315 degrees is used to sample an edge.

That is, the edge sample signal E135 of the fifth generation corresponds to a data sample signal in the third generation, and the edge sample signal E315 of the fifth generation corresponds to an edge sample signal in the third generation.

The clock gate circuit 400 selects and outputs a clock signal having a required phase among a plurality of multi-phase clock signals generated by the phase interpolation circuit 300 in the manner as described above according to the selection signal GEN. Accordingly, in an embodiment, the clock gate circuit 400 outputs all of the plurality of multi-phase clock signals when the selection signal GEN indicates a fifth generation, outputs the multi-phase clock signals corresponding to phases of 45, 135, 225, and 315 degrees when the selection signal GEN indicates a fourth generation, and outputs the multi-phase clock signals corresponding to phases of 135 and 315 degrees when the selection signal GEN indicates a first, second, or third generation.

Returning to FIG. 1, the data edge selection circuit 210 selects the data signal DT and the edge signal ED according to the selection signal GEN.

In the case of the fifth generation as shown in FIG. 2A, the data signal Data is selected from the parallel data signal DP, and the edge signal Edge is selected from the parallel edge signal EP.

However, as shown in FIG. 2B, in the case of the 4th generation, both the data signal Data and the edge signal Edge must be selected from the parallel edge signal EP.

In this way, the data edge selection circuit 210 generates a data signal DT and an edge signal ED by selecting a required signal according to the selection signal GEN from the parallel data signal DP and the parallel edge signal EP. Thus, in the illustrated embodiment, the data edge selection circuit 210 may select a signal corresponding to the edge sample signal E135 as the data signal DT when the selection signal GEN indicates the first, second, or third generations, may select the edge sample signals E45 and E225 as the data signal DT when the selection signal GEN indicates the fourth generation, and may select the data sample signals D0, D90, D180, and D270 as the data signal DT when the selection signal GEN indicates the fifth generation.

The control circuit 220 adjusts the phase of the phase interpolation circuit 300 using information of the data signal DT and the edge signal ED, as is generally done in the conventional clock data recovery (CDR) technology field. Therefore, a detailed description will be omitted.

The equalization circuit 100 samples the data input signal DI according to the multi-phase clock signal CK and outputs the data sample signal D and the edge sample signal E.

As described above, the edge sample signal E for a generation may correspond to a data sample signal for another generation. Accordingly, while the edge sample signals E may correspond to sampled edges when receiving signals transmitted according to the fifth generation, they may in some cases correspond to sampled data when receiving signals transmitted according to the first, second, third, or fourth generations.

The equalization circuit 100 includes a sampling equalizer 110 and an equalization control circuit 120.

The sampling equalizer 110 performs an equalization operation together with sampling the data input signal DI in order to output the data sample signal D and the edge sample signal E.

The equalization control circuit 120 controls the equalization operation of the sampling equalizer 110 by providing a weight signal k and a feedback signal x to the sampling equalizer 110.

At this time, the feedback signal x is selected from the data sample signal D and the edge sample signal E output from the sampling equalizer 110 according to the selection signal GEN, and the weight signal k may be controlled in various ways according to an algorithm used for an equalization operation.

There may be a plurality of the weight signals k and a plurality of the feedback signals x respectively paired with the plurality of weight signals k, respectively.

Figure 3:
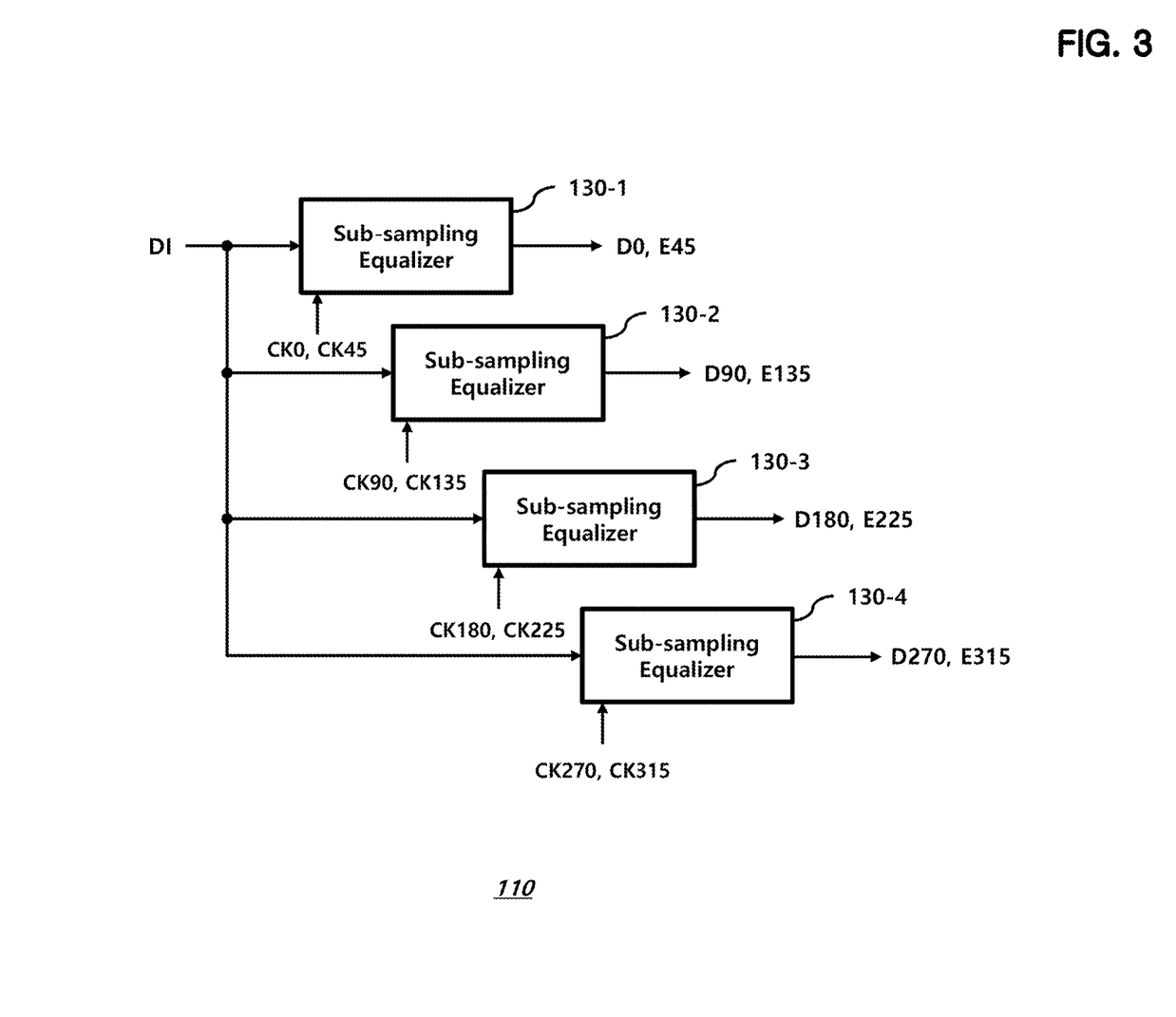
FIG. 3 illustrates a sampling equalizer according to an embodiment of the present disclosure.

FIG. 3 is a detailed block diagram of a sampling equalizer 110 according to an embodiment of the present disclosure.

The sampling equalizer 110 includes first, second, third, and fourth sub-sampling equalizers 130-1, 1302-2, 130-3, and 130-4, which may be generically referred to as sub-sampling equalizers 130. FIG. 3 shows a sampling equalizer 110 having four sub-sampling equalizers 130, but embodiments are not limited thereto.

All of the sub-sampling equalizers 130 have substantially the same structure, and only the phase of the input clock signal CK received by each sub-sampling equalizer and the phases of the output data sample signal D and the edge sample signal E produced by each sub-sampling equalizer are different.

First, the first sub-sampling equalizer 130-1 samples the data input signal DI according to the clock signals CK0 and CK45 corresponding to the phases of 0 and 45 degrees and outputs the data sample signal D0 and the edge sample signal E45.

Next, the second sub-sampling equalizer 130-2 samples the data input signal DI according to the clock signals CK90 and CK135 corresponding to the phases of 90 and 135 degrees and outputs a data sample signal D90 and an edge sample signal E135.

Next, the third sub-sampling equalizer 130-3 samples the data input signal DI according to the clock signals CK180 and CK225 corresponding to the phases of 180 and 225 degrees and outputs a data sample signal D180 and an edge sample signal E225.

Finally, the fourth sub-sampling equalizer 130-4 samples the data input signal DI according to the clock signals CK270 and CK315 corresponding to the phases of 270 and 315 degrees and outputs a data sample signal D270 and an edge sample signal E315.

The number of sub-sampling equalizers 130 may vary depending on the number of phases of the multi-phase clock signal. Furthermore, in embodiments supporting a plurality of generations of an interface standard, the number of sub-sampling equalizers 130 that are activated and used may depend on the number of phases of the multi-phase clock signal used to transfer data in the generation the circuit is presently configured for.

In the cases of the fourth and fifth generations shown in FIGS. 2A and 2B, all the sub-sampling equalizers 130 are activated and used.

In the case of the first, second, or third generation as shown in FIG. 2C, since only phases of 135 and 315 degrees are used, the first sub-sampling equalizer 130-1 and the third sub-sampling equalizer 130-3 are not used and may be deactivated.

In FIG. 3, the weight signal k and the feedback signal x applied to each of the sub-sampling equalizers 130 are not specifically displayed. This will be described in detail below.

Figure 4:
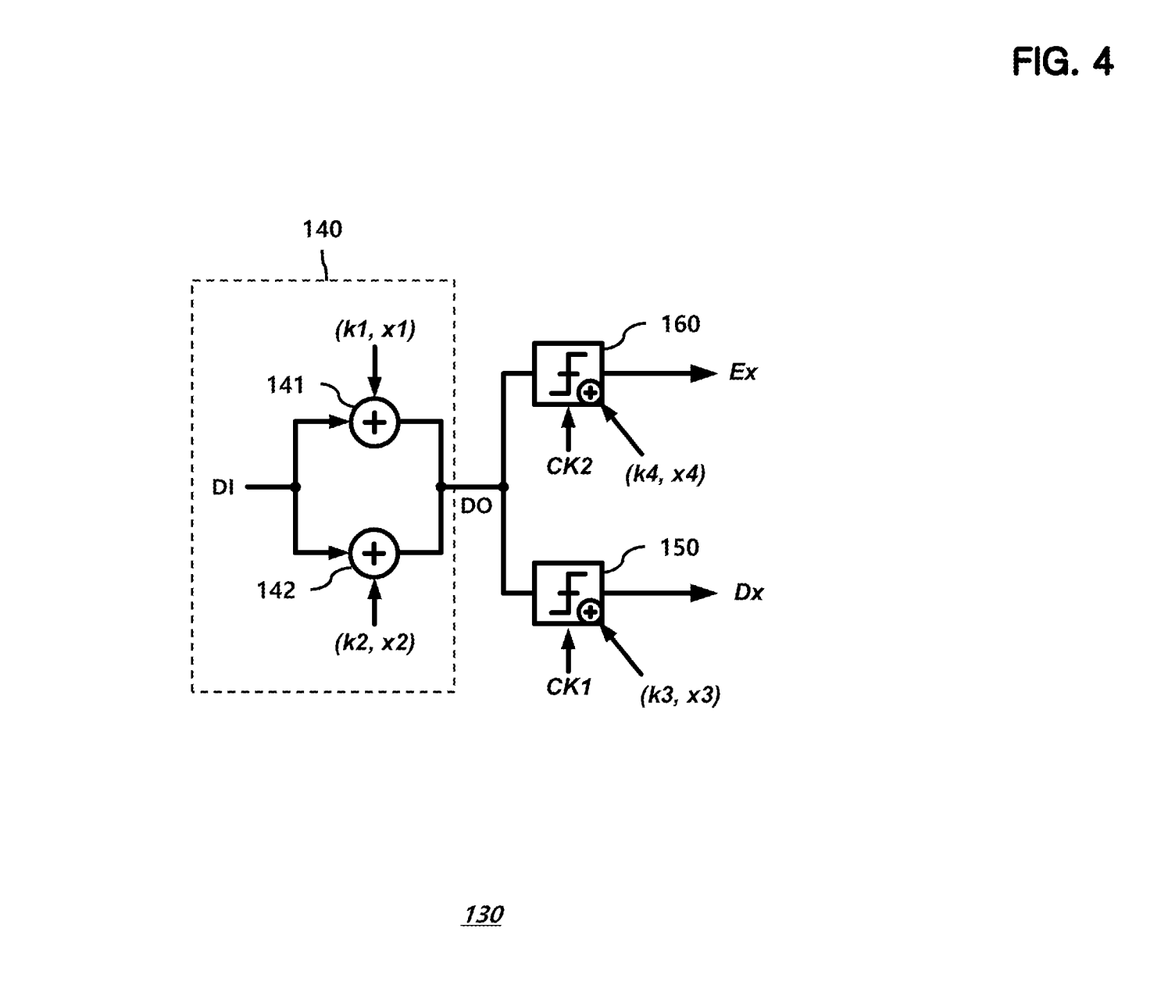
FIG. 4 illustrates a sub-sampling equalizer according to an embodiment of the present disclosure.

FIG. 4 is a detailed block diagram of a sub-sampling equalizer 130 according to an embodiment of the present disclosure.

The sampling equalizer 130 includes a first equalizer 140, a data sampling equalizer 150, and an edge sampling equalizer 160.

The first equalizer 140 includes a first equalization signal receiving circuit 141 and a second equalization signal receiving circuit 142, and equalizes the data input signal DI to provide a data output signal D0.

The first equalization signal receiving circuit 141 performs an equalization operation by receiving the first weight signal k1 and the first feedback signal x1, and the second equalization signal receiving circuit 142 receives the second weight signal k2, and the second feedback signal x2 to perform an equalization operation. The first through fourth feedback signals x1 to x4 each correspond to a respective one of the data output signals D or edge sample signals E output by the sampling equalizer 110, as described below, and accordingly may be binary signals. The first through fourth weight signals k1 to k4 each represent an equalization parameter, and may include analog signals in some embodiments and multi-bit digital signals in other embodiments.

The data sampling equalizer 150 samples the data output signal D0 according to the first clock signal CK1 and outputs the data sample signal Dx while performing the equalization operation according to the third weight signal k3 and the third feedback signal x3.

The edge sampling equalizer 160 samples the data output signal D0 according to the second clock signal CK2 and outputs the edge sample signal Ex while performing the equalization operation according to the fourth weight signal k4 and the fourth feedback signal x4.

Figure 5:
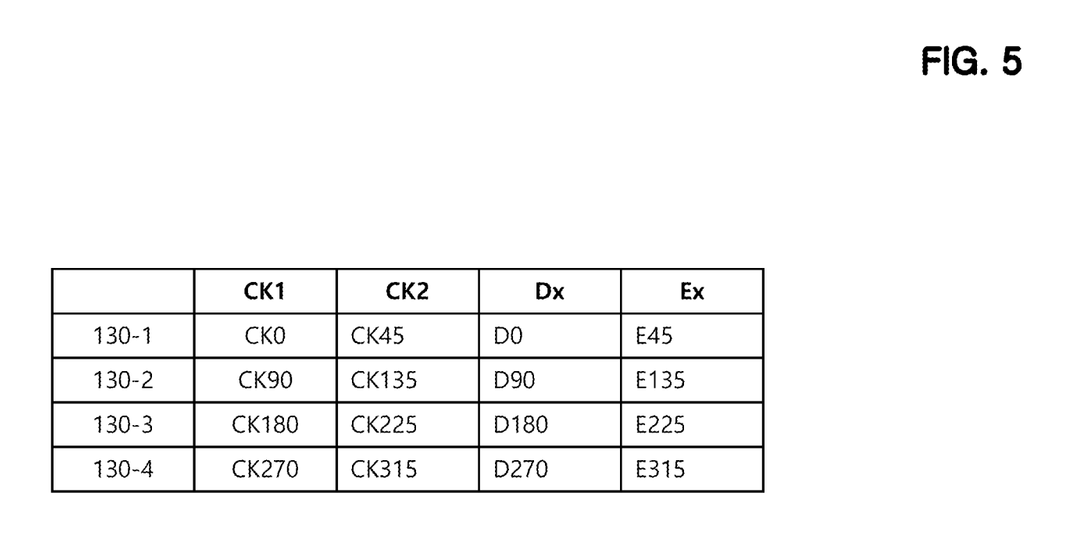
FIG. 5 illustrates signals of a sub-sampling equalizer according to an embodiment of the present disclosure.

FIG. 5 is a table showing signals input/output to a sub-sampling equalizer according to an embodiment of the present disclosure.

The table may be derived from FIGS. 3 and 4.

For example, when the sub-sampling equalizer 130 corresponds to the first sub-sampling equalizer 130-1, the first clock signal CK1 thereof receives a clock signal CK0 corresponding to a 0 degree phase, and the second clock signal CK2 thereof receives a clock signal CK45 corresponding to a 45 degree phase.

Furthermore, the data sample signal Dx output therefrom is a data sample signal D0 corresponding to a 0 degree phase, and the edge sample signal Ex output therefrom is an edge sample signal E45 corresponding to a 45 degree phase.

Figure 6:
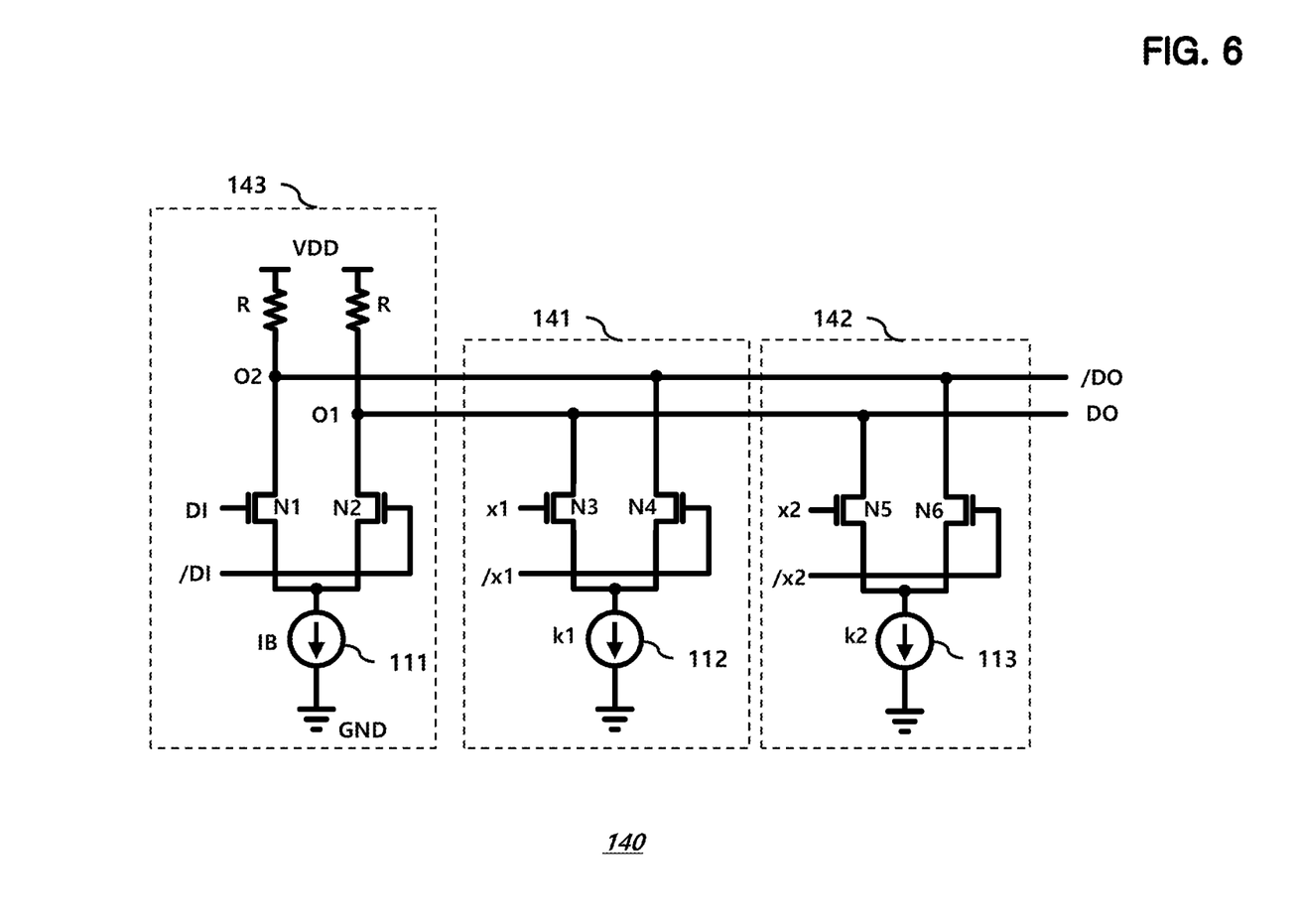
FIG. 6 illustrates a first equalizer according to an embodiment of the present disclosure.

FIG. 6 is a circuit diagram showing a first equalizer 140 according to an embodiment of the present disclosure.

The first equalizer 140 includes a data signal receiving circuit 143, a first equalization signal receiving circuit 141, and a second equalization signal receiving circuit 142.

The data signal receiving circuit 143 receives the differential data input signal DI and generates a differential data output signal D0.

The data output signal D0 is produced at the first node O1 and the inverted data output signal /D0 is produced at the second node O2.

The data signal receiving circuit 143 may be a general differential amplifier.

First, a load resistor R is connected between the first power source VDD and the first node O1, and another load resistor R is connected between the first power source VDD and the second node O2.

The data signal receiving circuit 143 includes a first NMOS transistor N1 having a gate receiving a data input signal DI and a drain connected to the second node O2, and a second NMOS transistor N2 having a gate receiving an inverted data input signal /DI and a drain connected to the first node O1. Respective sources of the first NMOS transistor N1 and the second NMOS transistor N2 are coupled in common.

The data receiving circuit 143 includes a bias current source 111 that provides a fixed bias current IB between the common sources of the NMOS transistors N1 and N2 and the second power source GND.

The first equalization signal receiving circuit 141 includes an NMOS transistor N3 having a gate supplied with a first feedback signal x1 and a drain connected to the first node O1, and an NMOS transistor N4 having a gate supplied with an inverted first feedback signal /x1 and a drain connected to the second node O2. Respective sources of the third NMOS transistor N3 and the fourth NMOS transistor N4 are coupled in common.

The first equalization signal receiving circuit 141 further includes a bias current source 112 that provides a bias current corresponding to the first weight signal k1 to the common sources of the NMOS transistors N3 and N4 from the second power source GND.

The second equalization signal receiving circuit 142 includes an NMOS transistor N5 having a gate supplied with a second feedback signal x2 and a drain connected to the first node O1, and an NMOS transistor N6 having a gate supplied with an inverted second feedback signal /x2 and a drain connected to the second node O2. Respective sources of the fifth NMOS transistor N5 and the sixth NMOS transistor N6 are coupled in common.

The second equalization signal receiving circuit 142 further includes a bias current source 113 that provides a bias current corresponding to the second weight signal k2 to the common sources of the NMOS transistors N5 and N6 from the second power source GND.

The first weight signal k1, the second weight signal k2, the first feedback signal x1, and the second feedback signal x2 are provided from the equalization control circuit 120 according to the selection signal GEN. This will be described again in detail below.

Figure 7:
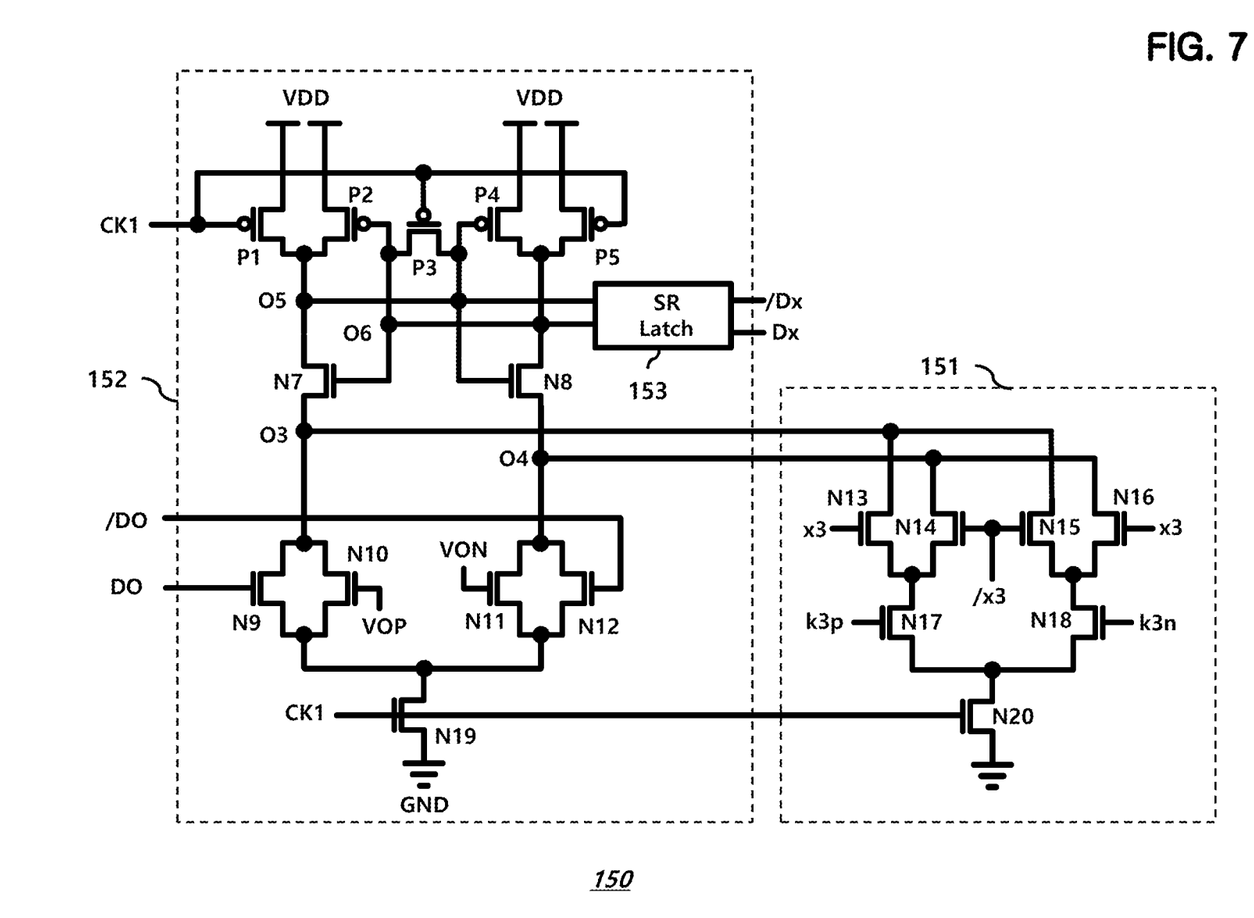
FIG. 7 illustrates a data sampling equalizer according to an embodiment of the present disclosure.

FIG. 7 is a circuit diagram showing a data sampling equalizer 150 according to an embodiment of the present disclosure.

The data sampling equalizer 150 includes a data equalization circuit 151 and a data sampling circuit 152.

The data equalization circuit 151 performs an equalization operation according to an equalization signal provided from the equalization control circuit 120.

The equalization signal includes a third weight signal k3 and a third feedback signal x3, such as shown in FIG. 5.

The embodiment in FIG. 7 uses a differential signal, and accordingly the third weight signal k3 includes a positive third weight signal k3p and a negative third weight signal k3n.

The relationship between the third weight signal k3, the positive third weight signal k3p, and the negative third weight signal k3n is as follows.

The positive third weight signal k3p corresponds to a value obtained by adding a value corresponding to the third weight signal k3 to a predetermined common value, and the negative third weight signal k3n corresponds to the value obtained by subtracting a value corresponding to the third weight signal k3 from the predetermined common value.

The data equalization circuit 151 includes a thirteenth NMOS transistor N13 having a drain connected to the third node O3 and a gate receiving a third feedback signal x3 and a fourteenth NMOS transistor N14 having a drain connected to the fourth node O4 and a gate receiving an inverted third feedback signal /x3.

Respective sources of the NMOS transistors N13 and N14 are connected in common.

The data equalization circuit 151 further includes a fifteenth NMOS transistor N15 having a drain connected to the third node O3 and a gate receiving the inverted third feedback signal /x3, and a sixteenth NMOS transistor N16 having a drain connected to the fourth node O4 and a gate receiving a third feedback signal x3.

Respective sources of the NMOS transistors N15 and N16 are connected in common.

The data equalization circuit 151 further includes a seventeenth NMOS transistor N17 having a drain connected to the sources of the thirteenth and fourteenth NMOS transistors N13 and N14 and a gate receiving the positive weight signal k3p, and an eighteenth NMOS transistor N18 having a drain connected to the sources of the fifteenth and sixteenth NMOS transistors N15 and N16 and a gate receiving the negative weight signal k3n.

Respective sources of the NMOS transistors N17 and N18 are connected in common.

The data equalization circuit 151 further includes a twentieth NMOS transistor N20 whose drain is connected to the sources of the seventeenth and eighteenth NMOS transistors N17 and N18, a gate receiving the first clock signal CK1, and a source connected to the second power source GND.

The data sampling circuit 152 includes a ninth NMOS transistor N9 having a drain connected to the third node O3 and a gate receiving a data output signal D0, and a tenth NMOS transistor N10 having a drain connected to the third node O3 and a gate receiving a positive offset voltage VOP.

Respective sources of the NMOS transistors N9 and N10 are connected in common.

The data sampling circuit 152 further includes an eleventh NMOS transistor N11 having a drain connected to the fourth node O4 and a gate receiving a negative offset voltage VON, and a twelfth NMOS transistor N12 having a drain connected to the fourth node O4 and a gate receiving an inverted data output signal/D0.

Respective sources of the NMOS transistors N11 and N12 are connected in common.

The positive offset signal VOP is a value obtained by adding a predetermined offset voltage to a common voltage, and the negative offset signal VON corresponds to a value obtained by subtracting a predetermined offset voltage from the common voltage.

The data sampling circuit 152 further includes a nineteenth NMOS transistor N19 having a drain connected to the sources of the ninth, tenth, eleventh, and twelfth NMOS transistors N9, N10, N11, and N12, a gate receiving the first clock signal CK1, and a source connected to the second power source GND.

The data sampling circuit 152 includes a second PMOS transistor P2 and a seventh NMOS transistor N7 connected in series between the first power source VDD and a third node O3 and forming an inverter having an input node connected to the sixth node O6 and an output node connected to a fifth node O5.

The data sampling circuit 152 further includes a fourth PMOS transistor P4 and an eight NMOS transistor N8 connected in series between the first power source VDD and the fourth node O4 and forming an inverter having an input node connected to the fifth node O5 and an output node connected to the sixth node O6.

The data sampling circuit 152 further includes a first PMOS transistor P1 having a gate receiving the first clock signal CK1, a source is connected to the first power source VDD, and a drain connected to the fifth node O5, a fifth PMOS transistor P5 having a gate receiving the first clock signal CK1, a source is connected to the first power source VDD, and a drain connected to the sixth node O6, and a third PMOS transistor P3 having a gate receiving the first clock signal CK1 and a source and a drain connected between the fifth node O5 and the sixth node O6. Accordingly, the second and fourth PMOS transistors P2 and P4, and the seventh and eighth NMOS transistors N7 and N8 comprise a cross-coupled latch operated according to the first clock signal CK1, as described below.

When the first clock signal CK1 is at a low level, the fifth node O5 and the sixth node O6 are charged with the power voltage VDD by the first, third, and fifth PMOS transistors P1, P3, and P5.

When the first clock signal CK1 is at a high level, a difference occurs in voltages between the fifth node O5 and the sixth node O6 according to the data output signal D0, and the voltage difference is amplified according to the operation of the cross-coupled inverters comprising the second and fourth PMOS transistors P2 and P4 and the seventh and eighth NMOS transistors N7 and N8. During this process, an equalization operation is performed according to the third weight signal k3 and the third feedback signal x3.

The data sampling circuit 152 further includes a SR latch 153 outputting the data signal Dx according to the voltages of the fifth node O5 and the sixth node O6. When the first clock signal CK1 is at the low level, the SR latch 153 maintains a value of the data signal Dx corresponding to the values of the fifth and sixth nodes N5 and N6 when the first clock signal CK1 was last at the high level.

The edge sampling equalizer 160 has substantially the same configuration as the data sampling equalizer 150, but receives and produces different signals.

For example, the edge sampling equalizer 160 may receive a second clock signal CK2 instead of the first clock signal CK1, a fourth weight signal k4 instead of the third weight signal k3, and a fourth feedback signal x4 instead of the third feedback signal x3, and may produce an edge sample signal Ex instead of the data sample signal Dx and an inverted edge sample signal/Ex instead of the inverted data sample signal/Dx, in accordance with FIG. 4.

That is, the edge sampling equalizer 160 may include an edge sampling circuit corresponding to the data sampling circuit 152 and an edge equalizing circuit corresponding to the data equalizing circuit 151.

Since the specific circuit configuration will be substantially the same, detailed disclosure will be omitted.

FIGS. 8A, 8B, 8C, and 8D show tables for explaining the operation of the equalization control circuit 120.

The equalization control circuit 120 selects and outputs the first to fourth weight signals and the first to fourth feedback signals according to the selection signal GEN.

Figure 8A:
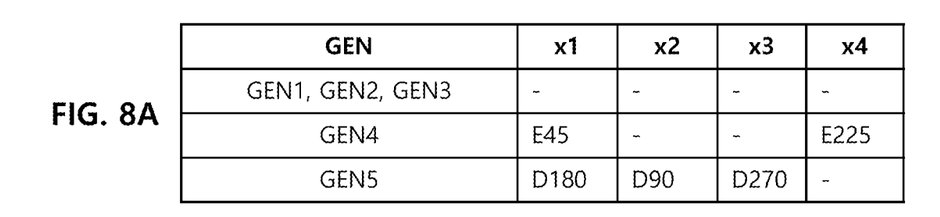
FIGS. 8A, 8B, 8C, and 8D illustrate operations of an equalization control circuit according to an embodiment of the present disclosure.

In FIGS. 8A to 8D, '-' indicates a case in which the weight signal and the feedback signal are not applied or have no effect on the equalization operations. In embodiments, a corresponding weight signal may be set to '0' when a corresponding entry in FIGS. 8A to 8D is '-'. For, example, the second and the third weight signals k2, k3p, and k3n may be set to '0' when the selection signal GEN corresponds to the fourth generation GEN4 as shown in FIG. 8A. In other embodiments that use both a feedback signal and a corresponding inverted feedback signal, such as shown for first and second feedback signals x1 and x2 in FIG. 6, both the feedback signal, such as first and second feedback signals x1 and x2, and the corresponding inverted feedback signal, such as first and second inverted feedback signals /x1 and /x2, are given low (inactive) values when the corresponding entry in FIGS. 8A to 8D are '-'.

Figure 8B:
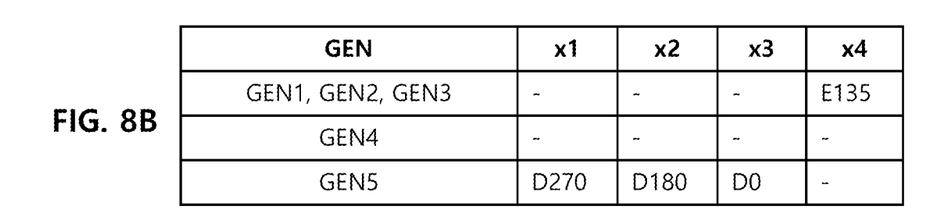
Figure 8C:
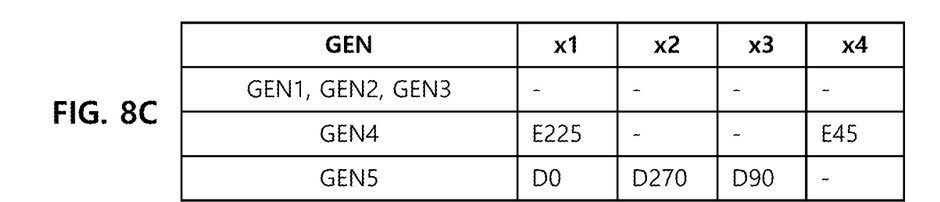
Figure 8D:
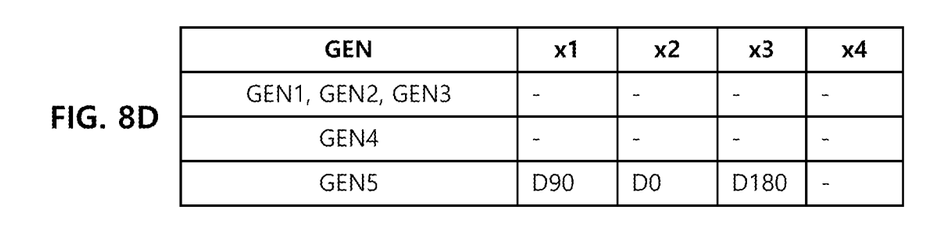

FIG. 8A corresponds to signals provided to the first sub-sampling equalizer 130-1, FIG. 8B corresponds to signals provided to the second sub-sampling equalizer 130-2, FIG. 8C corresponds signals provided to the third sub-sampling equalizer 130-3, and FIG. 8D corresponds signals provided to the fourth sub-sampling equalizer 130-4.

This will be described with reference to FIG. 8A as an example. Note that when the selection signal GEN corresponds to the first, second, or third generation, the first sub-sampling equalizer 130-1 is not used for equalization. Accordingly, in the illustrated embodiment, all the weight signals provided to the first sub-sampling equalizer 130-1 are set to '0' when the selection signal GEN corresponds to the first, second, or third generation.

When the selection signal GEN corresponds to the fourth generation GEN4, the equalization control circuit 120 provides the edge sample signal E45 to the first equalization signal receiving circuit 141 as the first feedback signal x1, and provides the edge sample signal E225 is provided to the edge sampling equalizer 160 as a fourth feedback signal x4.

In this case, the edge sample signal E45 is an edge sample signal output from the first sub-sampling equalizer 130-1, and the edge sample signal E225 is an edge sample signal output from the third sub-sampling equalizer 130-3.

When the selection signal GEN corresponds to the fifth generation GEN5, the equalization control circuit 120 provides the data sample signal D180 to the first equalization signal receiving circuit 141 as the first feedback signal x1, provides+the data sample signal D90 as the second feedback signal x2, and provides the data sample signal D270 to the data sampling equalizer 150 as a third feedback signal x4.

At this case, the data sample signal D180 is a data sample signal output from the third sub-sampling equalizer 130-3, the data sample signal D90 is a data sample output from the second sub-sampling equalizer 130-2, and the data signal D270 is a data sample signal output from the fourth sub-sampling equalizer 130-4.

Since operations corresponding to FIGS. 8B to 8D can be understood in the same manner as described above, repeated descriptions will be omitted. Accordingly, only the second sub-sampling equalizer 130-2 performs an equalization operation when the selection signal GEN corresponds to first, second, or third generations GEN1, GEN2, or GEN3, only the first and third sub-sampling equalizers 130-1 and 130-3 perform equalization operations when the selection signal GEN corresponds to the fourth generation GEN4, and all the sub-sampling equalizers 130 perform equalization operations when the selection signal GEN corresponds to the fourth generation GEN5.

The first to fourth weight signals provided by the equalization control circuit 120 may be adjusted by an equalization algorithm during the equalization operation.

Since the equalization algorithm itself can be variously designed and changed by a person skilled in the art, it is not disclosed in detail.

Although various embodiments have been illustrated and described, various changes and modifications may be made to the described embodiments without departing from the spirit and scope of the invention as defined by the following claims.

What is claimed is:

1. A receiver comprising:
    an equalization circuit configured to output a data sample signal and an edge sample signal by sampling a data input signal according to a multi-phase clock signal, and to perform an equalization operation according to the data sample signal and the edge sample signal; and
    a clock gate circuit configured to select the multi-phase clock signal from among a plurality of multi-phase clock signals according to a selection signal
    wherein the equalization circuit comprises:
        a sampling equalizer configured to generate the data sample signal and the edge sample signal according to the multi-phase clock signal; and
        an equalization control circuit configured to select a plurality of feedback signals from among the data sample signal and the edge sample signal and to generate a plurality of weight signals respectively corresponding to the plurality of feedback signals,
    wherein the sampling equalizer performs an equalization operation according to the plurality of weight signals and the plurality of feedback signals.

2. The receiver of claim 1, further comprising a multi-phase clock generation circuit configured to generate the plurality of multi-phase clock signals.

3. The receiver of claim 1, further comprising a phase interpolator adjusting phases of the plurality of multi-phase clock signals.

4. The receiver of claim 3, further comprising a phase control circuit providing a phase control signal used for controlling a phase adjusting operation of the phase interpolator according to the data sample signal and the edge sample signal.

5. The receiver of claim 4, wherein the phase control circuit comprises:
    a data edge selection circuit configured to:
    generate a data signal by selecting, according to the selection signal, a signal that samples data from among the data sample signal and the edge sample signal; and
    generate an edge signal by selecting, according to the selection signal, a signal that samples an edge from among the data sample signal and the edge sample signal; and
    a control circuit configured to generate the phase control signal according to the data signal and the edge signal.

6. The receiver of claim 5, further comprising:
    a data parallelization circuit configured to parallelize the data sample signal and provide the parallelized data sample signal to the phase control circuit; and
    an edge parallelization circuit configured to parallelize the edge sample signal and provide the parallelized edge sample signal to the phase control circuit.

7. The receiver of claim 1, wherein the sampling equalizer includes:
    a first equalizer configured to generate a data output signal by receiving a data input signal; and
    a data sampling equalizer configured to output the data sample signal by sampling the data output signal according to a first clock signal among the multi-phase clock signal; and
    an edge sampling equalizer configured to output the edge sample signal by sampling the data output signal according to a second clock signal among the multi-phase clock signal,
    wherein the first equalizer, the data sampling equalizer, and the edge sampling equalizer perform equalization operations according to the plurality of feedback signals and the plurality of weight signals.

8. The receiver of claim 7, wherein the first equalizer comprises:
    a data receiving circuit configured to generate the data output signal by amplifying the data input signal; and
    a first equalization receiving circuit configured to adjust the data output signal according to a first weight signal of the plurality of weight signals and a first feedback signal of the plurality of feedback signals.

9. The receiver of claim 8, wherein the first equalizer further comprises a second equalization receiving circuit configured to adjust the data output signal according to a second weight signal of the plurality of weight signals and a second feedback signal of the plurality of feedback signals.

10. The receiver of claim 7, wherein the data sampling equalizer comprises:
    a data sampling circuit configured to output the data sample signal by sampling the data output signal according to the first clock signal; and a data equalization signal configured to perform an equalization operation on the data output signal according to a third weight signal of the plurality of weight signals and a third feedback signal of the plurality of feedback signals.

11. The receiver of claim 7, wherein the edge sampling equalizer comprises:
    an edge sampling circuit configured to output the edge sample signal by sampling the data output signal according to the second clock signal; and
    an edge equalization signal configured to perform an equalization operation on the data output signal according to a fourth weight signal of the plurality of weight signals and a fourth feedback signal of the plurality of feedback signals.

12. The receiver of claim 6, wherein the sampling equalizer includes a plurality of sub-sampling circuits, a sub-sampling circuit among the plurality of sub-sampling circuits comprising:
    a first equalizer configured to generate a data output signal by sampling the data input signal; and
    a data sampling equalizer configured to generate a data sample signal by sampling the data output signal according to a first clock signal among the multi-phase clock signal; and
    an edge sampling equalizer configured to generate an edge sample signal by sampling the data output signal according to a second clock signal among the multi-phase clock signal;
    wherein the first equalizer, the data sampling equalizer, and the edge sampling equalizer perform equalization operations according to the plurality of feedback signals and the plurality of weight signals.

13. The receiver of claim 1, wherein the selection signal indicate a generation of a peripheral component interconnect express (PCIe) interface technology.

* * * * *